Dec. 31, 1963 K. J. MILLER 3,116,184

ETCHING OF GERMANIUM SURFACES PRIOR TO EVAPORATION OF ALUMINUM

Filed Dec. 16, 1960 2 Sheets-Sheet 1

INVENTOR
K. J. MILLER
BY
ATTORNEY

INVENTOR
K. J. MILLER
BY George S. Indig
ATTORNEY

United States Patent Office 3,116,184
Patented Dec. 31, 1963

3,116,184

ETCHING OF GERMANIUM SURFACES PRIOR TO EVAPORATION OF ALUMINUM

Kenneth J. Miller, Gillette, N.J., assignor to Bell Telephone Laboratories, Incorporated, New York, N.Y., a corporation of New York Filed Dec. 16, 1960, Ser. No. 76,379
3 Claims. (Cl. 148—179)

Figure 1A:
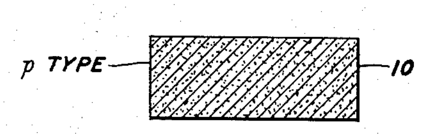

This invention relates to a novel method for the fabrication of semiconductive devices, more particularly of the kind generally designated as junction transistors.

A junction transistor generally comprises a semiconductive body, commonly of germanium, which includes a plurality of contiguous zones of different conductivity types defining two or more p-n junctions in the body. In the usual form of junction transistor, a germanium body comprises a base region of one conductivity type, for example, p-type which is intermediate between and contingous with emitter and collector zones of opposite or n-type conductivity. In common alternative forms, the emitter may be a point contact electrode making rectifying contact with the base zone, or an intrinsic region may be interposed between the base and collector zones as described in an article, entitled "P-N-I-P and N-P-I-N Junction Transistor Triodes," by J. M. Early, published in the Bell System Technical Journal, May 1954, pages 517 through 534.

It is characteristic of the mode of operation of junction transistors of this kind that minority charge carriers are injected into the base zone from the emitter under the control of signal information. These carriers then easily penetrate the forward biased collector junction and so pass into that region. The injected carriers in the usual form of junction transistor move across the base zone largely as a result of diffusion, although it is possible by proper gradient in the concentration of significant impurity atoms in the base zone to establish a "built-in" electrostatic field which imparts a drift to the injected minority carriers to augment diffusion. It is characteristic of the role of the base zone in such operation that it, to a large degree, determines the output characteristics of the transistors. For uniformity of output characteristics from one transistor to another, it is necessary to have uniformity in the base zones among the transistors. Accordingly, it is important that the method of making such transistors be one which lends itself conveniently to good reproducibility of the base zones.

However, it is further characteristic of the role of the base zone in a junction transistor that particular configurations and impurity distributions are necessary therefore which militate against reproducibility. In particular, since the transit time of the minority carriers across the base zone serves as an upper limit on the frequency of operation at which significant gain is realized, it is important for good high frequency response that the width of the base zone be narrow.

One method for the fabrication of a junction transistor which permits good control, better reproducibility and simultaneously results in a configuration which is characterized by improved performance, has been described in copending application Serial No. 496,202, filed May 23, 1955, now Patent No. 3,028,655.

In brief, the above-noted application describes a method wherein arsenic is diffused from a vapor state into the surface of a p-type germanium body to form an n-type surface zone of prescribed characteristics. In combination with this diffusion technique for forming the base zone there is described therein the formation of the emitter zone of the junction transistor by the evaporation on a selected portion of the diffused surface layer for subsequent fusion thereto, of a controlled amount of significant impurity elements of a type whose properties are opposite to those of the diffusant introduced previously to form the diffused surface layer. The emitter zone zone is advantageously formed by the evaporation and subsequent alloying of an aluminum film on the arsenic-diffused surface layer. The choice of aluminum is found advantageous since in such an application it has desirable wetting properties which facilitate good control of emitter geometry.

The aluminum film may be alloyed to the arsenic-diffused surface layer for forming the emitter zone by a heating cycle which includes heating for about one minute at the eutectic temperature followed by a flash heating for less than one second at a higher temperature or in the alternative by other techniques such as ionic bombardment as described in copending application Serial No. 141,512, filed January 31, 1950, now Patent No. 2,750,541.

Hitherto, difficulties have been encountered in obtaining reproducible uniform low resistance aluminum-germanium alloy emitter stripes on germanium. Specifically, the problem has been to avoid the aluminum alloy "balling-up" into localized globules on solidification. The emitters of such transistors have an increased current density which leads to unique switching problems.

In accordance with this invention there is described a method for etching germanium surfaces using an aqueous hydrogen peroxide solution as the etchant prior to alloying of aluminum, relying on the solubility of hexagonal germanium oxide.

The use of this method has resulted in an improvement in the transistor electrical parameter $\beta$ as compared with the use of a conventional fluoride-containing etch treatment and also in improved reproducibility and uniformity of alloying.

Figure 1B:
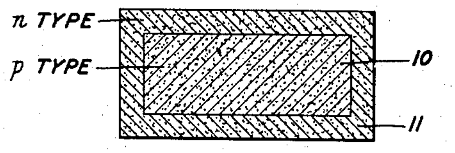
Figure 1C:
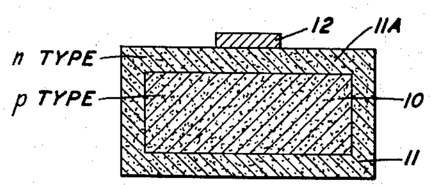
Figure 1D:
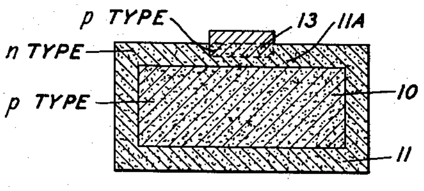
Figure 1E:
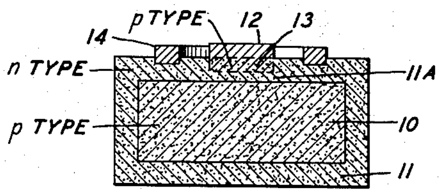
Figure 1F:
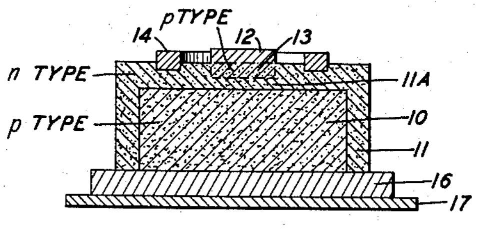
Figure 1G:
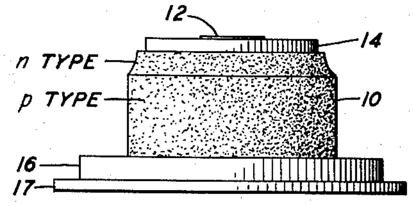
Figure 2:
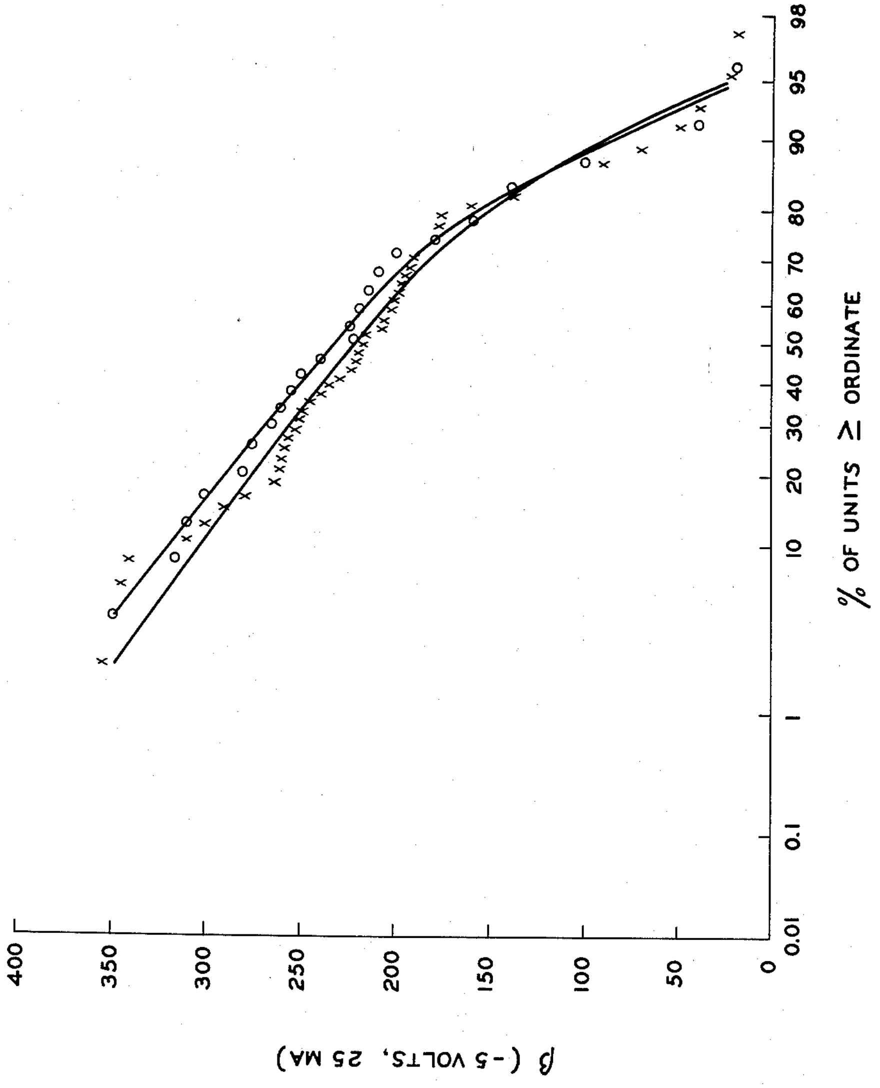

The invention will be understood from the following detailed description taken in conjunction with the drawings in which:

FIGS. 1A through 1G show in cross section in successive stages of desired process of manufacture a diffused base junction transistor of p-n-p type, made in accordance with this invention; and FIG. 2 is a graph on coordinates of $\beta$ (minus 5 volts, 25 milliamperes) against the percentage of device units which shows the measurement of $\beta$ before thermal compression bonding as a function of hydrogen fluoride and hydrogen peroxide etching before flash evaporation and alloying and indicates the degree of reproducibility realized by the practice of the present invention.

With further reference now to the drawing, FIG. 1A shows a germanium wafer 10 which has a thickness or height of 10 mils and a radius of 50 mils. The germanium wafer is a single crystal material of p-type conductivity and advantageously of about 5 ohm-centimeters resistivity. Typically, such a resistivity and conductivity type is obtained by doping the germanium melt from which the single crystal is grown, with a material such as gallium.

As a preliminary step, it is usually important to rid the surface of the wafer of all traces of undesirable impurities, especially copper which is a particularly active impurity in germanium. To this end, the wafer is advantageously soaked in potassium cyanide in accordance with a method described in copending application, Serial No. 334,972, filed February 3, 1953, by R. A. Logan and M. Sparks, now Patent No. 2,698,780, and thereafter washed with deionized water and blotted dry.

The clean germanium wafer is now ready for the formation of a surface diffusion layer of n-type conductivity.

The clean germanium wafer is loaded into an oven, preferably of molybdenum since such an oven can be more readily kept copper free. There is also inserted into the oven a charge of germanium, most economically of polycrystalline material but of high purity, which has been doped with arsenic to have a body concentration of arsenic which is larger by a prescribed amount than the arsenic concentration desired for the arsenic diffused surface layer to be formed on the wafer.

The germanium wafer is then heated in the oven at 800° C. for about fifteen minutes in the arsenic vapor which results from arsenic diffusing out of the heated polycrystalline germanium. The heat treatment recited results in a surface diffusion layer about 0.18 mil thick with a surface concentration of approximately $2\times10^{17}$ arsenic atoms per cubic centimeter in a surface conductivity of approximately $10^{-2}$ mhos per square centimeter.

Alternatively, a suitable arsenic-diffused surface layer may be formed by an alternate vapor solid diffusion process by heating an arsenic mass to a temperature which provides a suitable vapor pressure of arsenic and heating a germanium body in the presence of the arsenic vapor at a temperature suitable for diffusion of the arsenic into the wafer. Ordinarily, to avoid excessive surface concentrations of arsenic and at the same time achieve the desired amount of penetration of the arsenic, it is advantageous to have two zones of different temperatures and to heat the germanium wafer to a temperature higher than that used to vaporize the arsenic.

FIG. 1B shows the germanium wafer 10 over whose surface there is formed an n-type arsenic diffused layer 11. In the completed junction transistor, the interior portion or this arsenic diffused layer 11 serves as the base region.

It is characteristic of these surface diffusion techniques that the resistivity and thickness of the diffused layer can be readily controlled to a high degree of accuracy since all of the parameters involved are amenable to accurate control. Concentrations of arsenic atoms diffused through the surface of the germanium wafer can be made to have a prescribed value, and the depth of penetration of this diffused layer may be accurately controlled by the temperature and heating time. Accordingly, since all of the factors which control the resistivity and depth of penetration of this surface diffusion layer are amenable to accurate control and can readily be reproduced as often as desired, it is easy to manufacture in quantities wafers having similar arsenic-diffused surface layers.

After formation of this arsenic-diffused layer 11 the germanium wafer is cleaned in an aqueous solution of hydrogen peroxide having a concentration within the range of 2 to 5 percent. The use of concentrations greater than 5 percent is permissible but impractical whereas the use of concentrations less than 2 percent reduce the germanium removal rate unduly. The etching treatment is conducted at temperatures in the range of 20 to 50° C. for time periods of the order of two minutes. In order to prevent excessive removal of the n-layer from the germanium, control of depth of removal is required. This is accomplished by regulating the temperature and concentration of the hydrogen peroxide solution within the above noted ranges.

Oxidizing etchants, generally leave a thin film of oxide on a metallic surface, so necessitating their removal subsequent to etching. This is accomplished in the present invention by removing the surface layer of germanium dioxide after the dissolution reaction by high vacuum sublimation taking place at temperatures in excess of 575° C.

Specifically the germanium slabs are etched in hydrogen peroxide and heated to 600° C. in a vacuum bell jar at $10^{-}$ millimeters of mercury. In the alternative, a specially constructed glass vacuum system capable of $10^{-8}$ millimeters may be used to partially remove germanium dioxide surface films by germanium oxide sublimation. Results of aluminum alloyed germanium surfaces treated in this manner clearly indicate an improvement in wetting properties and uniformity.

Next, the emitter zone is formed by the evaporation on a selected portion of the diffused surface layer of the wafer of a metallic significant impurity which permits ease of control, advantageously, aluminum. To this end, it is important to mask those portions of the wafer which are to be kept free from the aluminum vapor during the evaporation process. Suitable masking techniques are known to one skilled in the art. Typically, the wafer may be supported in a structure which allows only a portion of the diffused surface layer of the wafer to be exposed to the aluminum vapor. It is desirable to observe precautions to prevent shadowing of the aluminum at the boundary of the film deposited. The process used for the evaporation should be one amenable to accurate control of the amount and the geometry of the aluminum deposited and advantageously one which does not involve appreciable heating of the germanium wafer. Suitable processes are described in a book, entitled "Vacuum Techniques," by S. Dushman, J. Wiley & Sons, New York, N.Y. (1949).

In FIG. 1C there is shown a germanium wafer 10 which has an arsenic-diffused surface layer 11 on a portion 11A of which there is deposited a film of aluminum 12 in a circular spot of about 40 mils diameter and a thickness of approximately 1,000 Angstroms.

The aluminum film is then alloyed to the germanium wafer to form a p-type aluminum-alloyed skin on the portion 11A of the n-type arsenic-diffused zone on which the aluminum film has been deposited. The alloying advantageously is accomplished by positioning the germanium wafer on a strip heater of the usual form and heating the wafer to the aluminum-germanium eutectic temperature of approximately 424° C. in a hydrogen atmosphere for approximately one minute. This first part of the alloying cycle assures uniform wetting of the germanium surface by the aluminum which is important for good reproducibolity of characteristics. Thereafter the germanium wafer is flash heated to about 700° C. for a short interval, advantageously about one-half second for forming a surface on the wafer which is about 55 percent aluminum and 44 percent germanium in terms of the number of atoms, for alloying of the aluminum to the germanium.

In FIG. 1D there is shown the germanium wafer after alloying of the aluminum film to its surface. In crystallizing, a regrowth portion 13 of the portion 11A of the arsenic-diffused surface layer 11 is converted to p-type because of the introduction of aluminum from the aluminum film 12. Modifications of this technique may be made such as heating the wafer slightly above the eutectic temperature during evaporation of the aluminum film.

There is made available as a result of the steps described a semiconductive body which is of p-n-p conductivity type distribution.

There is an n-type arsenic diffused layer 11A between the p-type bulk 10 and the p-type aluminum alloyed layer 13. For the formation of a p-n-p junction transistor, it is necessary to make appropriate electrode connections to the different zones of the body. In practice, it is found that there is a residual surface film of almost pure aluminum on the aluminum alloyed p-type zone 13 which may be used advantageously as the emitter electrode, but it is generally preferable to deposit a metallic film on the arsenic-diffused layer to serve as the base electrode.

There is accordingly formed on selected portions of the diffused surface layer 11 as another step of the process a metallic film to serve as the base electrode connection. To this end, there is advantageously evaporated a thin film of a gold-antimony alloy in annular configuration surrounding the emitter electrode 12 formed on the surface of the body. Any technique of the many known may be used for the deposition of the gold-antimony film so long as it permits a high degree of accuracy in the geometry and the amount of the film deposited and avoids significant heating of the germanium body. After the gold-antimony film has been deposited, the heating cycle is used to alloy the film to the arsenic-diffused surface layer of the body. To this end, the germanium wafer is heated to about 356° C. (the gold-germanium eutectic)

and then the heat source is turned off before the alloying of the film is complete. In particular, the heating is discontinued as soon as the gold-antimony film is observed to wet the wafer surface.

FIG. 1E shows the germanium wafer of FIG. 1D on which there has been added a gold-antimony ring electrode 14 surrounding the aluminum emitter electrode 12.

In the manufacturing of a semiconductive unit for use as a tetrode junction transistor, that is, one in which two spaced electrode connections are made to the base zone across which a direct current bias may be applied, instead of depositing a complete ring for surrounding the aluminum emitter electrode, two separate and spaced segments forming a split ring are deposited surrounding the aluminum emitter electrode.

There still remains formation of an ohmic connection to the bulk p-type portion of the body to serve as the collector electrode. To avoid having to remove the arsenic-diffused surface layer in the region to which the connection is to be made, it is advantageous to solder through the arsenic-diffused surface layer for bonding the collector electrode to the interior of the wafer. In such a case, it is desirable to include an acceptor impurity agent. As shown in FIG. 1F, a mass of indium 16 has been used as a solder to bond a platinum tab 17 which serves as the collector electrode to the back face (the face opposite that of the emitter electrode) of the germanium wafer, the indium penetrating completely through the thin arsenic-diffused skin. Advantageously, the same heating should be used for alloying the gold base film to one face of the germanium may be employed for alloying the collector electrode to the opposite face of the germanium. Then after the top face of the wafer has been suitably masked, the collector junction is revealed by placing (for approximately 40 seconds) the wafer in a suitable acid etch, for example, C.P.–4, described in U.S. Patent 2,619,414 which issued November 25, 1952. The protective mask is then removed from the emitter face. FIG. 1G shows the wafer after the collector junction has been revealed by the acid etch.

FIG. 2 shows a comparison of the transistor parameter $\beta$ (the common emitter gain of the transistor) obtained after treating a series of transistors with a hydrogen fluoride etch and after treating another series of transistors with a hyldrogen peroxide etch followed by vacuum sublimation. Each series of transistors was prepared in accordance with the procedure outlined above, one group being etched with a 3.4 volume percent hydrogen peroxide solution for one minute at 50° C. and the other group being etched with a concentrated hydrogen fluoride solution for one minute at 25° C. The results shown in the figure clearly indicate that higher $\beta$'s are favored by the oxidizing etch treatment, so improving the operating efficiency of the transistor.

What is claimed is:

1. In the process of forming a junction transistor comprising the steps of heating a p-type germanium wafer in arsenic vapor for a time and at a temperature to form an n-type arsenic-diffused surface zone, alloying aluminum into a selected portion of the arsenic-diffused surface zone for converting said portion to p-type, and forming an emitter connection to said aluminum alloyed portion, a base connection to the arsenic-diffused surface zone and a collector connection to the original p-type portion of the wafer, the improvement comprising in combination therewith successively etching the arsenic-diffused germanium wafer with a dilute solution of hydrogen peroxide, having a concentration within the range of 2 to 5 percent, at a temperature within the range of 20° to 50° C., and subjecting the said wafer to vacuum sublimation prior to alloying aluminum into the arsenic diffused layer.

2. The process according to the procedure of claim 1 wherein said solution of hydrogen peroxide is of a concentration of 3.4 percent.

3. The process according to the procedure of claim 2 wherein said etching is conducted at a temperature of about 25° C. for two minutes.

References Cited in the file of this patent

UNITED STATES PATENTS

| | | |
|---|---|---|
| 2,530,110 | Woodyard | Nov. 14, 1950 |
| 2,714,566 | Barton et al. | Aug. 2, 1955 |
| 2,740,699 | Koury | Apr. 3, 1956 |
| 2,796,368 | Jenny | June 18, 1957 |
| 2,840,885 | Cressell | July 1, 1958 |
| 2,935,781 | Heindenriech | May 10, 1960 |
| 2,948,642 | MacDonald | Aug. 9, 1960 |
| 2,974,075 | Miller | Mar. 7, 1961 |
| 3,009,841 | Faust | Nov. 21, 1961 |
| 3,028,655 | Dacey et al. | Apr. 10, 1962 |

FOREIGN PATENTS

| | | |
|---|---|---|
| 1,029,941 | Germany | May 14, 1958 |